US008344511B2

(12) United States Patent
Ichinose et al.

(10) Patent No.: US 8,344,511 B2
(45) Date of Patent: Jan. 1, 2013

(54) METHOD FOR MANUFACTURING A SEMICONDUCTOR DEVICE HAVING A SILICIDE REGION COMPRISED OF A SILICIDE OF A NICKEL ALLOY

(75) Inventors: Kazuhito Ichinose, Tokyo (JP); Yukari Imai, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/414,438

(22) Filed: Mar. 7, 2012

(65) Prior Publication Data
US 2012/0161244 A1 Jun. 28, 2012

Related U.S. Application Data

(62) Division of application No. 12/698,556, filed on Feb. 2, 2010, now Pat. No. 8,158,473.

(30) Foreign Application Priority Data

Feb. 12, 2009 (JP) ................................. 2009-030179

(51) Int. Cl.
H01L 23/48 (2006.01)
H01L 23/52 (2006.01)
H01L 29/40 (2006.01)
(52) U.S. Cl. ........ 257/751; 257/757; 257/761; 257/763; 257/764; 257/E23.157; 257/E23.163
(58) Field of Classification Search .................. 257/751, 257/757, 761, 763, 764, 766, E23.157, E23.163
See application file for complete search history.

(56) References Cited

U.S. PATENT DOCUMENTS

| 7,825,481 | B2 | 11/2010 | Chau et al. | |
|---|---|---|---|---|
| 7,851,357 | B2 | 12/2010 | Cabral et al. | |
| 8,174,093 | B2 * | 5/2012 | Hayasaka et al. | 257/621 |
| 2008/0135936 | A1 * | 6/2008 | Nakajima | 257/347 |
| 2008/0207000 | A1 | 8/2008 | Chou et al. | |
| 2008/0265417 | A1 | 10/2008 | Kawamura et al. | |
| 2010/0090292 | A1 | 4/2010 | Nakajima | |
| 2010/0129974 | A1 | 5/2010 | Futase et al. | |
| 2010/0148274 | A1 | 6/2010 | Tai et al. | |
| 2010/0314687 | A1 | 12/2010 | Xu | |
| 2011/0024908 | A1 * | 2/2011 | Lee et al. | 257/751 |
| 2011/0121393 | A1 | 5/2011 | Chau et al. | |
| 2011/0272664 | A1 * | 11/2011 | Tada et al. | 257/4 |
| 2011/0272753 | A1 | 11/2011 | Funayama et al. | |

FOREIGN PATENT DOCUMENTS

JP 2008-205010 9/2008

* cited by examiner

*Primary Examiner* — Ngan Ngo
(74) *Attorney, Agent, or Firm* — McDermott Will & Emery LLP

(57) ABSTRACT

To provide a semiconductor device which can reduce an electrical resistance between a plug and a silicide region, and a manufacturing method thereof. At least one semiconductor element having a silicide region, is formed over a semiconductor substrate. An interlayer insulating film is formed over the silicide region. A through hole having an inner surface including a bottom surface comprised of the silicide regions is formed in the interlayer insulating film. A Ti (titanium) film covering the inner surface of the hole is formed by a chemical vapor deposition method. At least a surface of the Ti film is nitrided so as to form a barrier metal film covering the inner surface. A plug is formed to fill the through hole via the barrier metal film.

3 Claims, 19 Drawing Sheets

METHOD FOR MANUFACTURING A SEMICONDUCTOR DEVICE HAVING A SILICIDE REGION COMPRISED OF A SILICIDE OF A NICKEL ALLOY

CROSS-REFERENCE TO RELATED APPLICATIONS

This application is a Divisional of U.S. application Ser. No. 12/698,556, filed on Feb. 2, 2010, now U.S. Pat. No. 8,158,473, claiming priority of Japanese Patent Application No. 2009-30179 filed on Feb. 12, 2009, the entire contents of each of which are hereby incorporated by reference.

BACKGROUND OF THE INVENTION

The present invention relates to a semiconductor device and a manufacturing method thereof, and more particularly, a semiconductor device with a silicide region, and a manufacturing method thereof.

Some semiconductor devices include a silicide layer and a plug. For example, Japanese Unexamined Patent Publication No. 2008-205010 (Patent Document 1) discloses a manufacturing method of such a semiconductor device including the following steps.

A silicide layer which is a nickel silicide layer or a nickel-platinum silicide layer is formed over a semiconductor substrate. Holes are formed in the silicide layer covered with an insulating film over the semiconductor substrate by dry etching. A Ti layer is formed at an inner surface of each hole by a chemical vapor deposition (CVD) method. A Ta layer is formed as a barrier metal layer on the Ti layer in the hole by sputtering. A copper layer is formed on the barrier layer to fill the hole, and the CMP is carried out thereby to form a copper plug.

As disclosed in the above patent document, a TiN layer may be formed between the barrier metal layer and the Ti layer by sputtering. The barrier metal layer is not limited to the Ta layer, and may be comprised of any one of or a combination of a Ta layer, TiN, TaN, Ru, WN, W—N—C, Ti—Si—$N_x$, Ta—Si—$N_x$, and W—Si—$N_x$.

RELATED ART DOCUMENTS

Patent Documents

Patent Document 1
Japanese Unexamined Patent Publication No. 2008-205010

SUMMARY OF THE INVENTION

In the technique disclosed in the above patent document, an insulating film is formed between the barrier metal layer (barrier metal film) and the silicide layer (silicide region) in some cases. This results in an increase in electrical resistance between the silicide region and the plug formed over the barrier metal film.

Accordingly, it is an object of the present invention to provide a semiconductor device that can reduce an electrical resistance between a plug and a silicide region, and a manufacturing method thereof.

A method for manufacturing a semiconductor device according to one embodiment of the invention includes the following steps. At least one semiconductor element, each having a silicide region comprised of silicide of a Ni (nickel) alloy, is formed over a semiconductor substrate. An interlayer insulating film is formed over the silicide region. A through hole having an inner surface including a side comprised of the interlayer insulating film and a bottom surface comprised of the silicide region is formed in the interlayer insulating film. A Ti (titanium) film covering the inner surface is formed by a chemical vapor deposition process. At least a surface of the Ti film is nitrided so as to form a barrier metal film covering the inner surface. A plug is formed to fill the through hole via the barrier metal film.

A semiconductor device according to another embodiment of the invention includes a semiconductor substrate, at least one semiconductor element, an interlayer insulating film, a barrier metal film, a plug, and an intermediate film. At least one semiconductor element is formed over the semiconductor substrate. Each of the at least one semiconductor element includes a silicide region comprised of a silicide of an alloy of Ni and at least one element X selected from the group comprising Pt (platinum), V (vanadium), Pd (palladium), Zr (zirconium), Hf (hafnium), and Nb (niobium). The interlayer insulating film is provided over the at least one semiconductor element. The interlayer insulating film is provided with a through hole having an inner surface including a side comprised of the interlayer insulating film and a bottom surface comprised of the silicide region. The barrier metal film includes a TiN (titanium nitride) film covering the inner surface. The plug fills the through hole via the barrier metal film. The intermediate film is formed between the silicide region and the barrier metal film. The total concentration of Ti (titanium)-Si (silicon)-O (oxygen)-N (nitrogen) bond and Ti (titanium)-X (element X)-Si (silicon)-O (oxygen)-N (nitrogen) bond in the intermediate film is higher than that of Ti (titanium)-Ni (nickel)-O (oxygen)-N (nitrogen) bond.

The manufacturing method of the semiconductor device according to the embodiment of the invention activates the reaction between the Ti film and the silicide region at the bottom surface of the through hole in nitriding the Ti film, so that the part in the insulated state between the Ti film and the silicide region is changed to an ohmic contact state. The electrical resistance between the silicide region and the barrier metal film formed by nitriding the Ti film is reduced. Thus, the electrical resistance between the plug formed over the barrier metal film and the silicide region can be reduced.

In the semiconductor device according to the embodiment of the invention, the concentration of Ti—Ni—O—N bond in the intermediate film is small. Thus, the insulating oxide film, which may be generated together with Ti—Ni—O—N bond, is prevented from being formed in the intermediate film. The electrical resistance of an electrical route between the barrier metal film and the silicide region via the intermediate film is reduced. Thus, the electrical resistance between the plugs formed over the barrier metal film and the silicide regions can be reduced.

DETAILED DESCRIPTION OF THE PREFERRED EMBODIMENTS

Preferred embodiments of the invention will be described below based on the accompanying drawings.

First Preferred Embodiment

First, the structure of a semiconductor device according to this embodiment will be described below.

Figure 1:
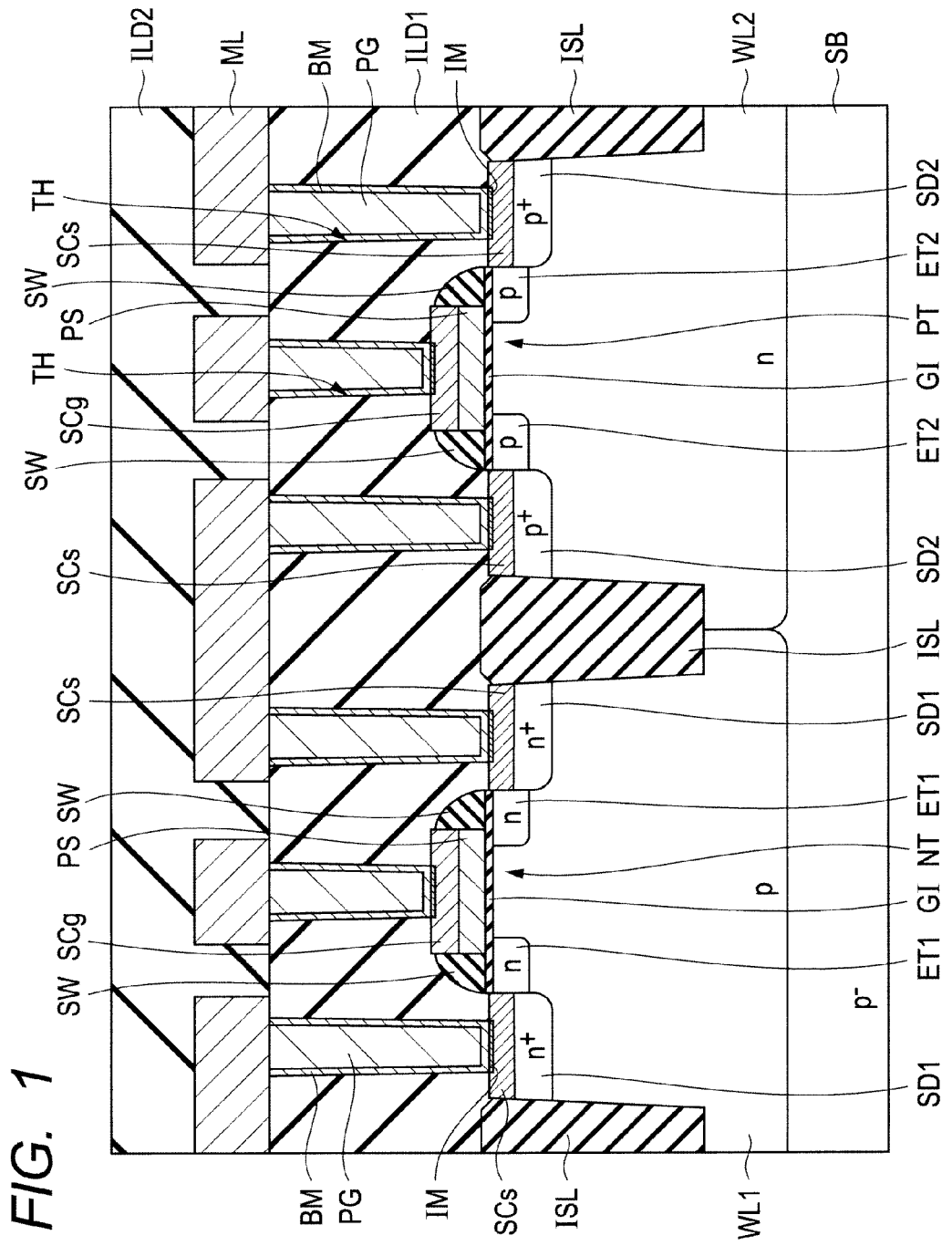
FIG. 1 is a cross-sectional view schematically showing the structure of a semiconductor device according to a first embodiment of the invention.
Figure 2:
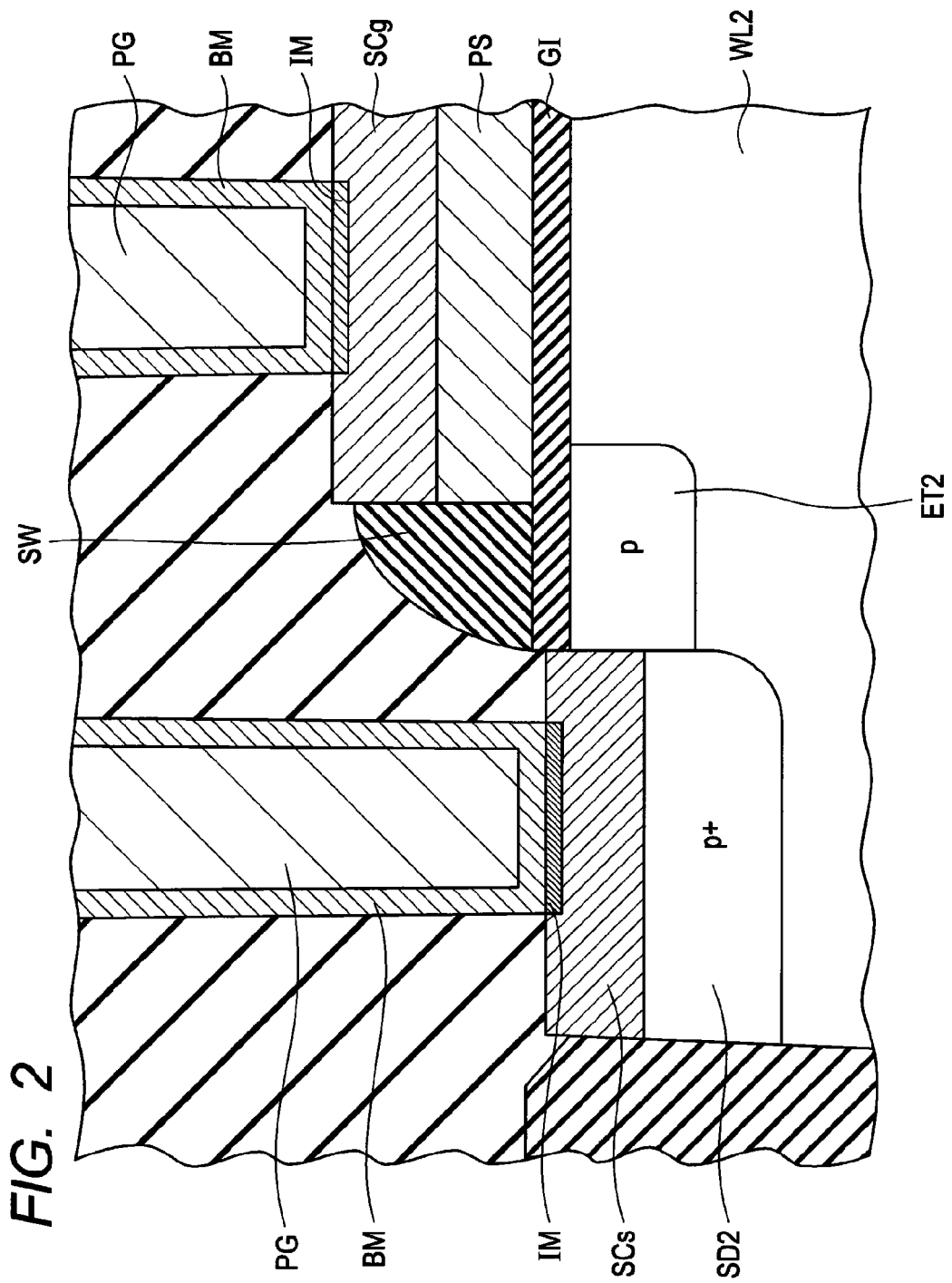
FIG. 2 is a partial enlarged view of FIG. 1.

Referring to FIGS. 1 and 2, the semiconductor device of this embodiment mainly includes a semiconductor substrate SB, a complementary metal oxide semiconductor (CMOS), an interlayer insulating film ILD1, a barrier metal film BM, a plug PG, an intermediate film IM, an element isolation insulating film ISL, a metal wiring layer ML, and an interlayer insulating film ILD2. The CMOS includes n-type and p-type transistors separated from each other by the element isolation insulating film ISL, namely, an n-MOS transistor NT (semiconductor element) and a p-MOS transistor PT (semiconductor element).

The n-MOS transistor NT is formed over the semiconductor substrate SB. The n-MOS transistor NT includes silicide regions SCs and SCg, a gate electrode including a polysilicon portion PS, source and drain regions SD1 and SD1, extension regions ET1 and ET1, a p-well WL1, a gate insulating film GI, and sidewalls SWs.

Each of the silicide regions SCs and SCg is formed of a Ni alloy silicide. More specifically, each of the silicide regions SCs and SCg is formed of a silicide of an alloy of Ni and at least one element X selected from the group comprising Pt, V, Pd, Zr, Hf, and Nb. The silicide regions SCs and SCg include a first silicide portion SCs in contact with the source drain region SD1 and a second silicide portion SCg serving as at least a part of the gate electrode.

The p-MOS transistor PT is formed over the semiconductor substrate SB. The p-MOS transistor PT includes silicide regions SCs and SCg, a gate electrode including a polysilicon portion PS, source and drain regions SD2 and SD2, extension regions ET2 and ET2, an n-well WL2, a gate insulating film GI, and sidewalls SWs.

Each of the silicide regions SCs and SCg is formed of a Ni alloy silicide. More specifically, each of the silicide regions SCs and SCg is formed of an alloy of Ni and at least one element X selected from the group comprising Pt, V, Pd, Zr, Hf, and Nb. The silicide regions SCs and SCg include a first silicide portion SCs in contact with the source/drain region SD2 and a second silicide portion SCg serving as at least a part of the gate electrode.

An interlayer insulating film ILD1 is provided over the p-MOS transistor PT and the n-MOS transistor NT. The interlayer insulating film ILD1 is provided with through holes THs, each having an inner surface including a side comprised of the interlayer insulating film ILD1 and a bottom surface comprised of the intermediate film IM.

The barrier metal film BM covers the inner surface of each through hole TH. The barrier metal film BM is comprised of a Ti film having at least one surface (on the plug PG side) thereof nitrided. That is, the barrier metal film BM includes a TiN film covering the inner surface of the through hole TH.

The plug PG fills the through hole TH via the barrier metal film BM. The plug PG is formed of, for example, W (tungsten).

The intermediate film IM is formed between each of the silicide regions SCs and SCg and the barrier metal film BM. The intermediate film IM includes a compound having a Ti—Si—O—N bond and a Ti—X—Si—O—N bond. The total concentration of the Ti—Si—O—N bond and the Ti—X—Si—O—N bond in the intermediate film IM is higher than that of the Ti—Ni—O—N bond.

Figure 3:
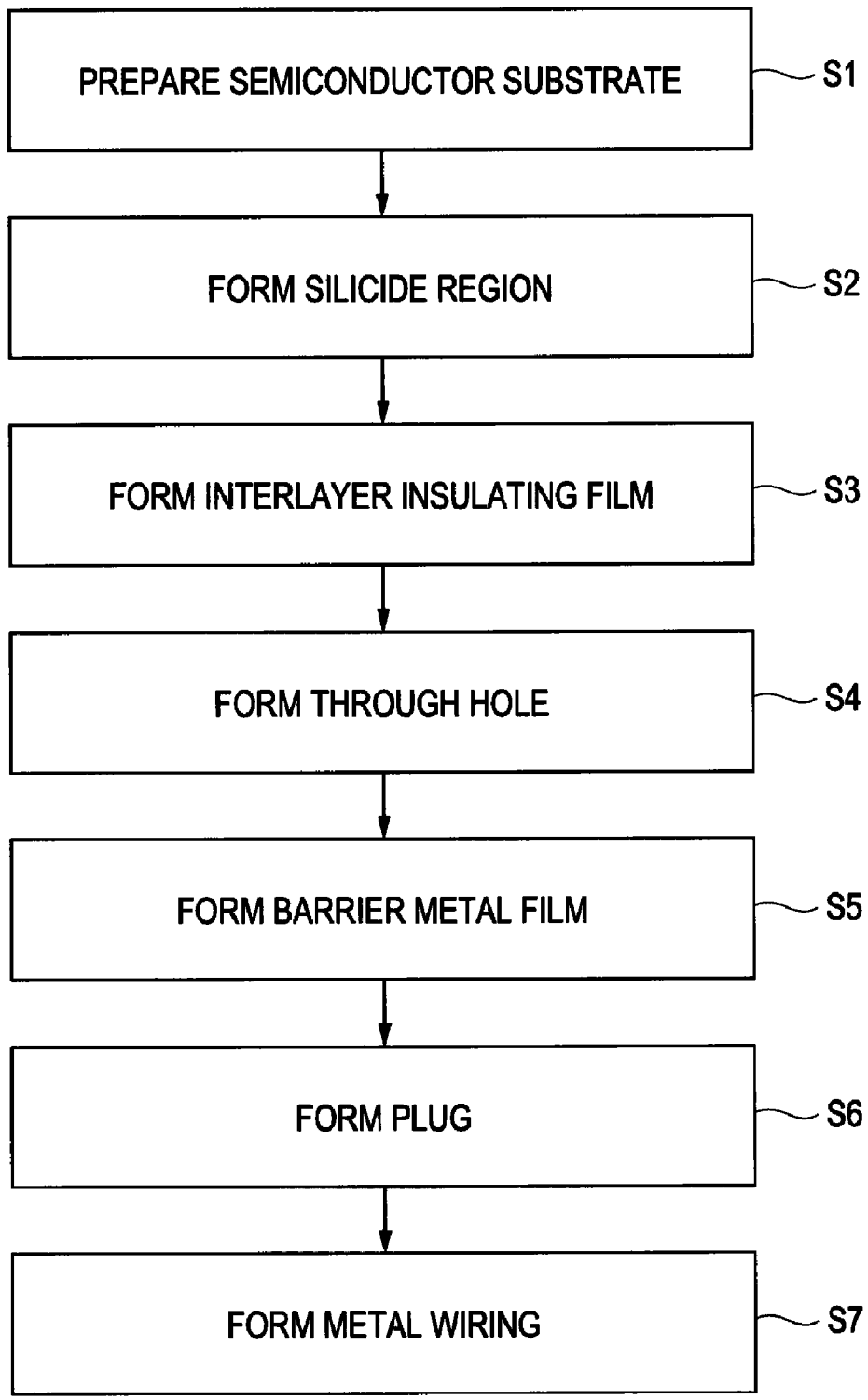
FIG. 3 is a flowchart for explaining a manufacturing method of the semiconductor device in the first embodiment of the invention.

Now, the outline of a manufacturing method of the semiconductor device in this embodiment will be described below. Referring to FIGS. 1 and 3, the semiconductor substrate SB is prepared in step S1. Then, the element isolation insulating film ISL, the p-well WL1, the n-well WL2, the gate insulating film GI, the source and drain regions SD1 and SD2, the extension regions ET1 and ET2, the polysilicon portion PS, and the sidewalls SWs are formed.

Figure 4:
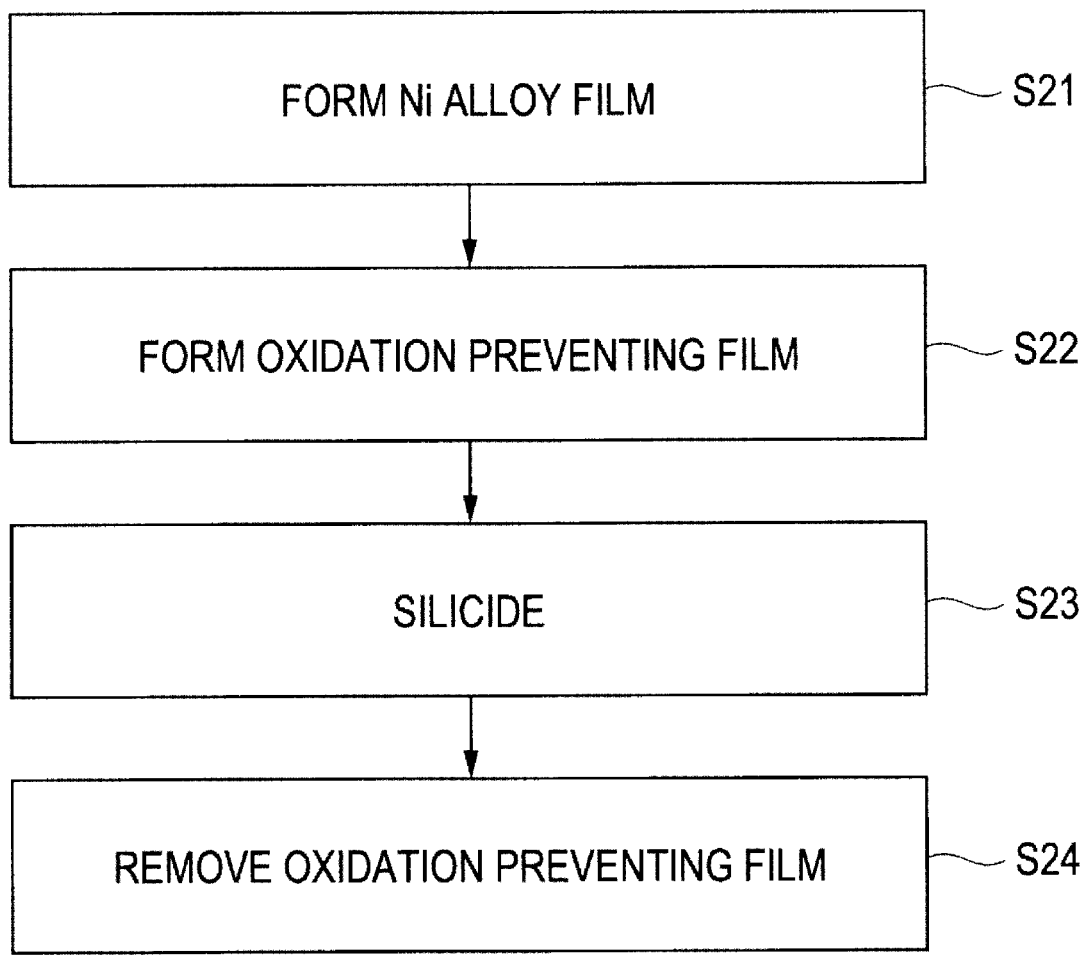
FIG. 4 is a flowchart for explaining processes for forming a silicide region shown in FIG. 3.
Figure 7:
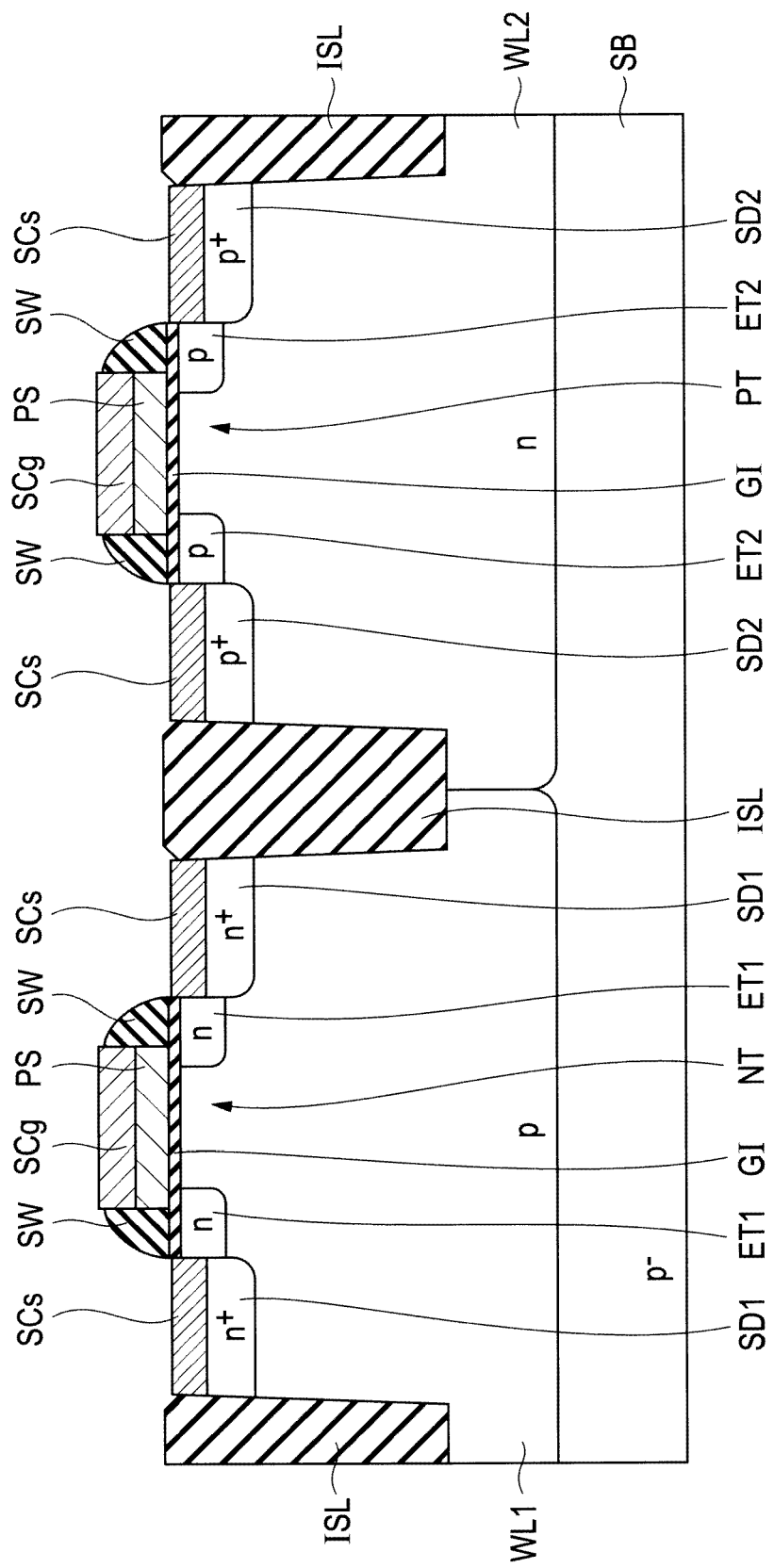
FIG. 7 is a cross-sectional view schematically showing a first step of the manufacturing method of the semiconductor device in the first embodiment of the invention.

Referring to FIGS. 3 and 7, in step S2, the first silicide portion SCs and the second silicide portion SCg are formed as a silicide region. The second silicide portion SCg together with the polysilicon portion PS forms the gate electrode. Specifically, the following processes insteps S21 to S24 (FIG. 4) are performed.

In step S21, a high-melting-point metal film (not shown) is formed to cover the polysilicon portion PS and the source and drain regions SD1 and SD2 in a vacuum unit evacuated to vacuum. The high-melting-point metal film is comprised of an alloy (Ni alloy) containing Ni as a principal component. More specifically, the high-melting-point metal film is comprised of material to which at least one element X selected from the group comprising Pt, V, Pd, Zr, Hf, and Nb is added. The amount of addition is less than 10 atom %. The formation method of the high-melting-point metal film is, for example, a physical vapor deposition (PVD) method or a CVD method.

In step S22, an oxidation preventing film (not shown) made of high-melting-point metal is formed over the high-melting-point metal film in the vacuum unit kept in a vacuum so as to prevent the oxidation of the above-mentioned high-melting-point metal film. The oxidation preventing film is, for example, a TiN film formed by the CVD method or PVD method.

In step S23, a silicide process is performed. In other words, heat treatment is performed to react the above high-melting-point metal film with the polysilicon portion PS and each of the source and drain regions SD1 and SD2. Specifically, for example, rapid thermal anneal (RTA) is performed thereby to form the first silicide portion SCs in contact with the source/drain region and the second silicide region SCg serving as at least a part of the gate electrode.

In step S24, the above-mentioned oxidation preventing film is removed. After the above steps S21 to S24 (step S2), the n-MOS transistor NT and the p-MOS transistor PT, each having the silicide regions SCs and SCg, are formed.

Figure 8:
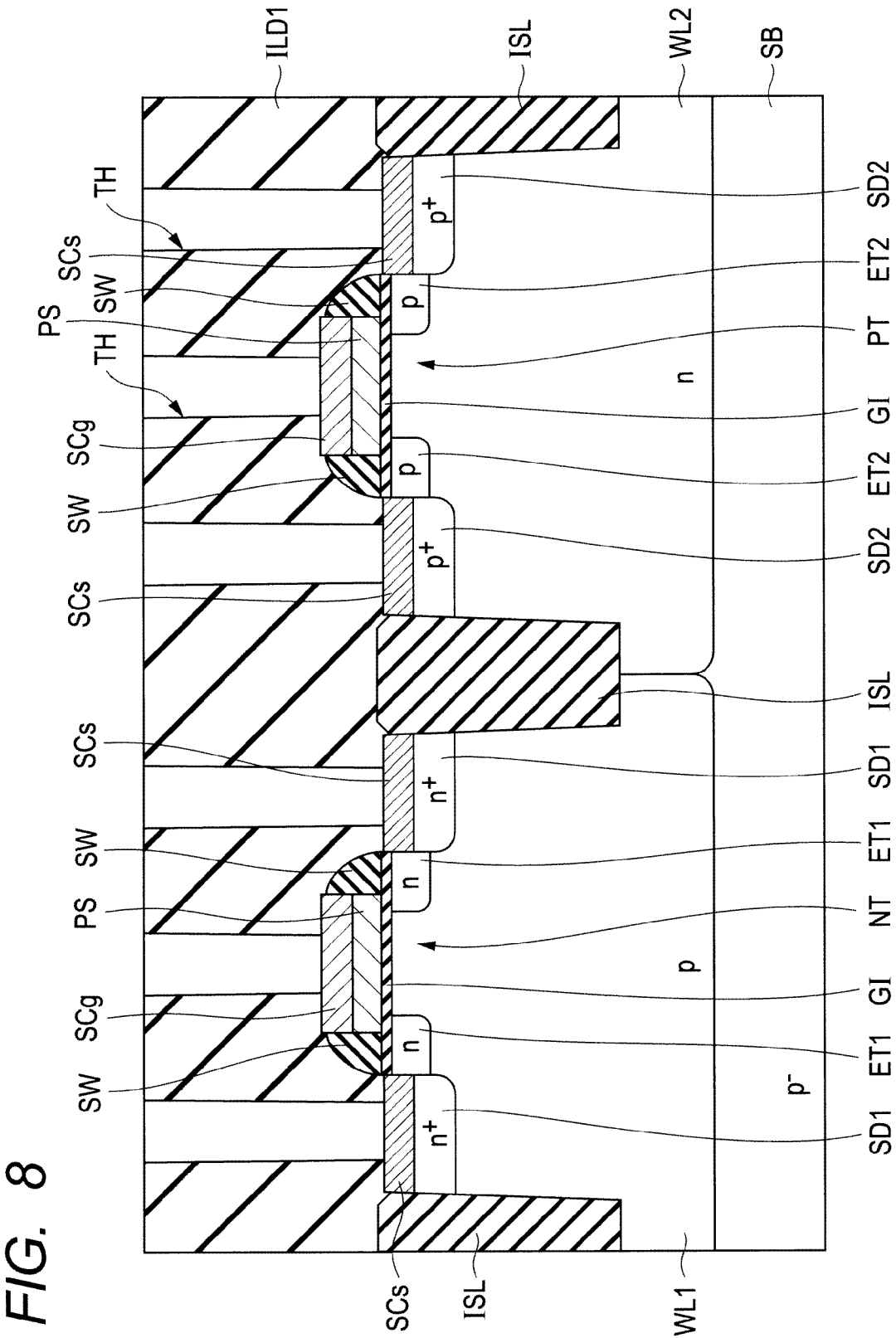
FIG. 8 is a cross-sectional view schematically showing a second step of the manufacturing method of the semiconductor device in the first embodiment of the invention.

Referring to FIGS. 3 and 8, in step S3, the interlayer insulating film ILD1 is formed over the silicide regions SCs and SCg.

Figure 5:
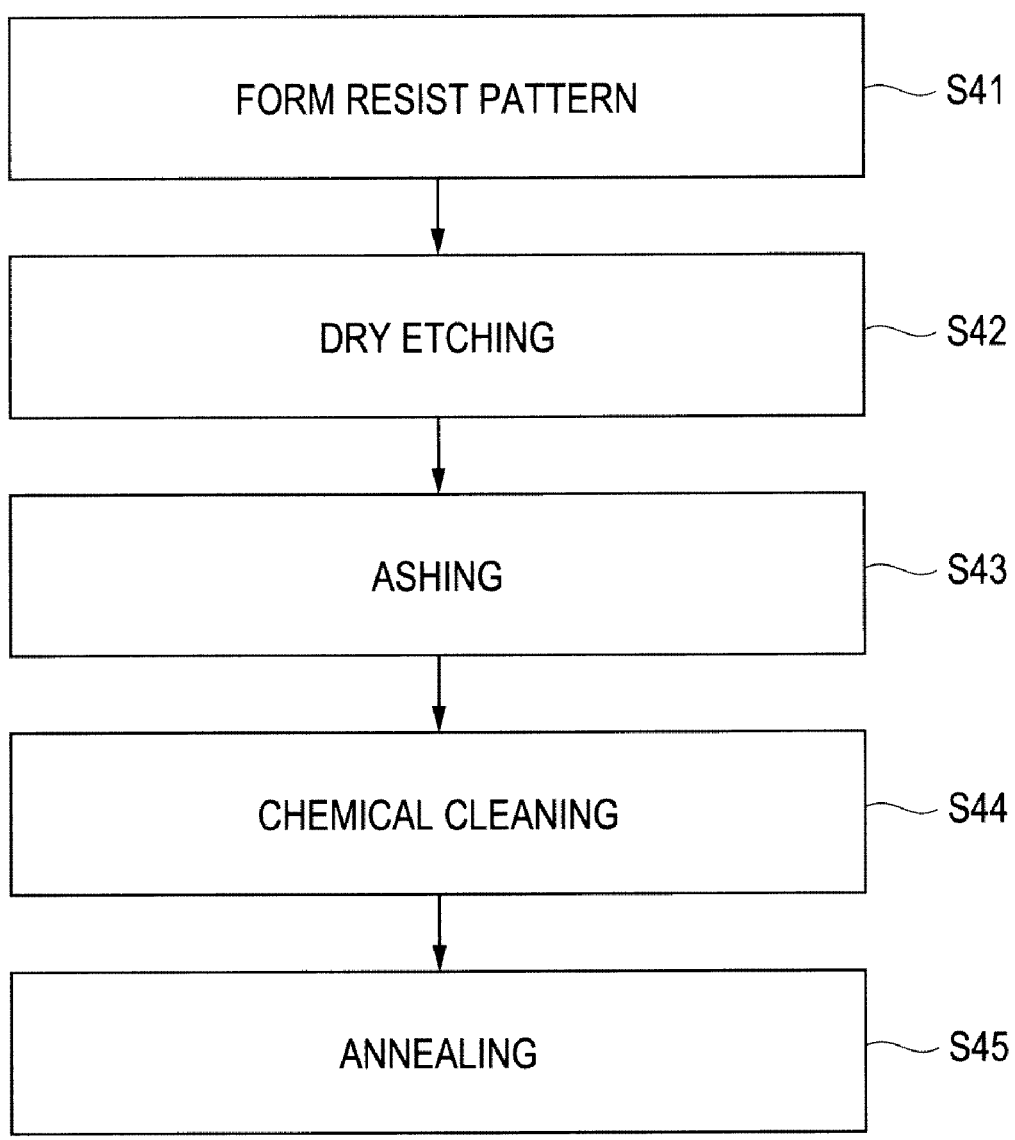
FIG. 5 is a flowchart for explaining processes for forming through holes shown in FIG. 3.

In step S4, through-holes THs are formed in the interlayer insulating film ILD1 with reference to FIGS. 3 and 8. Specifically, the following processes in steps S41 to S45 (see FIG. 5) will be described.

In step S41, a resist mask (not shown) having a pattern corresponding to a pattern of the through holes THs is formed over the interlayer insulating film ILD1. Specifically, application, exposure and development of the photoresist are performed.

In step S42, dry etching is performed using the above resist mask to form the through holes THs.

In step S43, ashing is performed to remove the above resist mask. In step S44, chemical cleaning is performed so as to remove the residue on each through hole TH after the step S43. The chemical cleaning is performed at a temperature of 100° C. or less using, for example, a mixed gas of $NH_3$ and HF.

In step S45, annealing is performed to remove by-products generated in the above chemical cleaning. Specifically, the annealing is performed at a temperature not less than 100° C. nor more than 300° C. in the same chamber as that in which the chemical cleaning is performed, or in another in-situ chamber.

In the processes of steps S41 to S45 described above (in step S4), the through hole TH having the inner surface, including the side comprised of the interlayer insulating film ILD1 and the bottom surface comprised of the silicide region SCs or SCg, is formed in the interlayer insulating film ILD1.

Mainly referring to FIG. 3, in step S5, the barrier metal film BM (see FIG. 10) is formed to cover the inner surface of the through hole. Specifically, the following processes in step S51 and S52 (see FIG. 6) will be performed.

After formation of the through holes TH (in step S4), in step S51, a Ti film TF (see FIG. 9) covering the inner surface of each through hole TH is formed under in-situ by the CVD method. The coating temperature in the CVD method is, for example, 550° C. or less.

Figure 9:
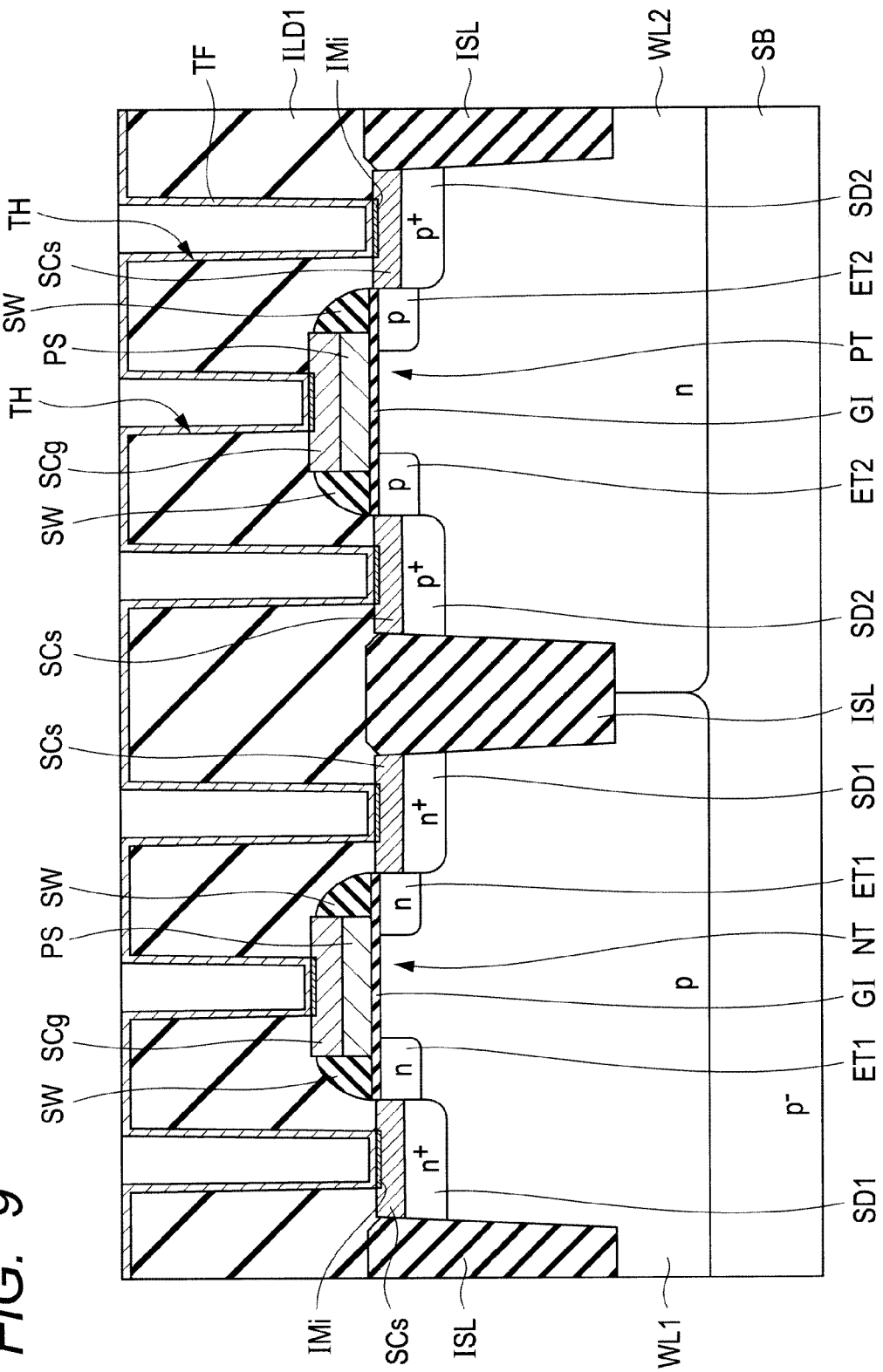
FIG. 9 is a cross-sectional view schematically showing a third step of the manufacturing method of the semiconductor device in the first embodiment of the invention.

In formation of the Ti film TF, an interfacial reaction is caused between each of the silicide regions SCs and SCg and the Ti film TF to form a film IMi between each of the silicide regions SCs and SCg and the Ti film TF. The film IMi may have a part including an insulator. In this case, the part in an insulated state is formed between each of the silicide regions SCs and SCg and the Ti film TF. Further, as shown in FIG. 9, the film IMi is formed within each of the silicide regions SCs and SCg.

Figure 10:
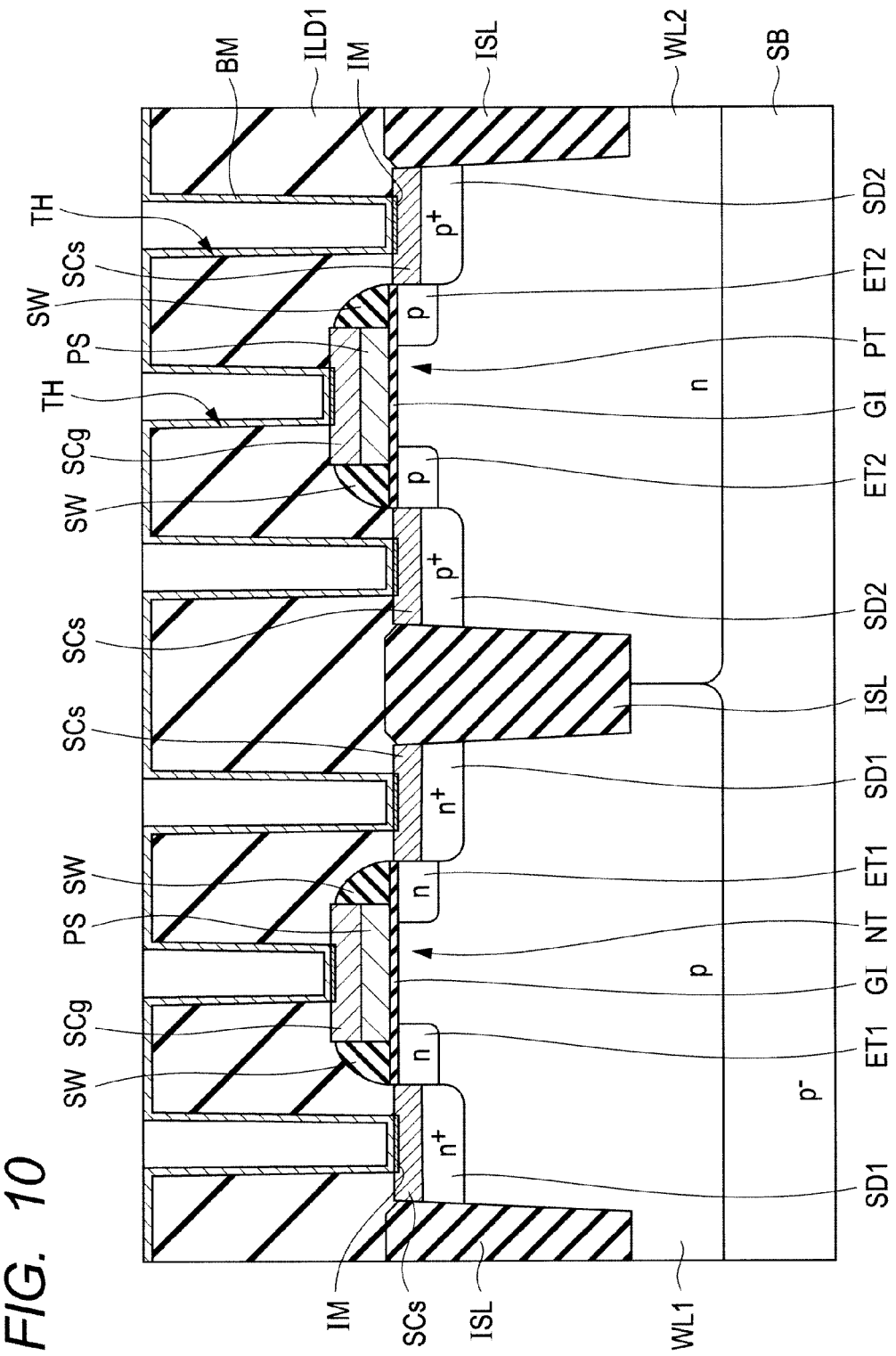
FIG. 10 is a cross-sectional view schematically showing a fourth step of the manufacturing method of the semiconductor device in the first embodiment of the invention.

In step S52, at least a surface of the Ti film TF (see FIG. 9) is nitrided thereby to form the barrier metal film BM (see FIG. 10). In the nitriding process, the Ti film TF is nitrided, and the intrusion of N (nitrogen) atoms into the film IMi is also caused. Further, the reaction between each of the silicide regions SCs and SCg and the Ti film TF is also activated in the nitriding process. Thus, the intermediate film IM (see FIG. 10) is formed from the film IMi (see FIG. 9). The intermediate film IM has at least either a Ti (titanium)-Si (silicon)-O (oxygen)-N (nitrogen) bond or a Ti (titanium)-X (element X)-Si (silicon)-O (oxygen)-N (nitrogen) bond, whose concentration in total is higher than that of Ti (titanium)-Ni (nickel)-O (oxygen)-N (nitrogen) bond. In formation of the intermediate film IM, the above-mentioned part in the insulated state between each of the silicide regions SCs and SCg and the barrier metal film BM is easily changed to an ohmic contact state.

Preferably, the Ti film TF is nitrided at a temperature of 400° C. or more so as to sufficiently perform the nitriding process, and at a temperature of 550° C. or less so as to prevent agglomeration of the silicide regions SCs and SCg. The nitriding of the Ti film TF is preferably performed by exposing the Ti film TF to an atmosphere containing plasma. The plasma is more preferably $NH_3$ plasma generated using $NH_3$ gas.

In the above steps S51 and S52 (step S5), the barrier metal BM is formed.

Figure 11:
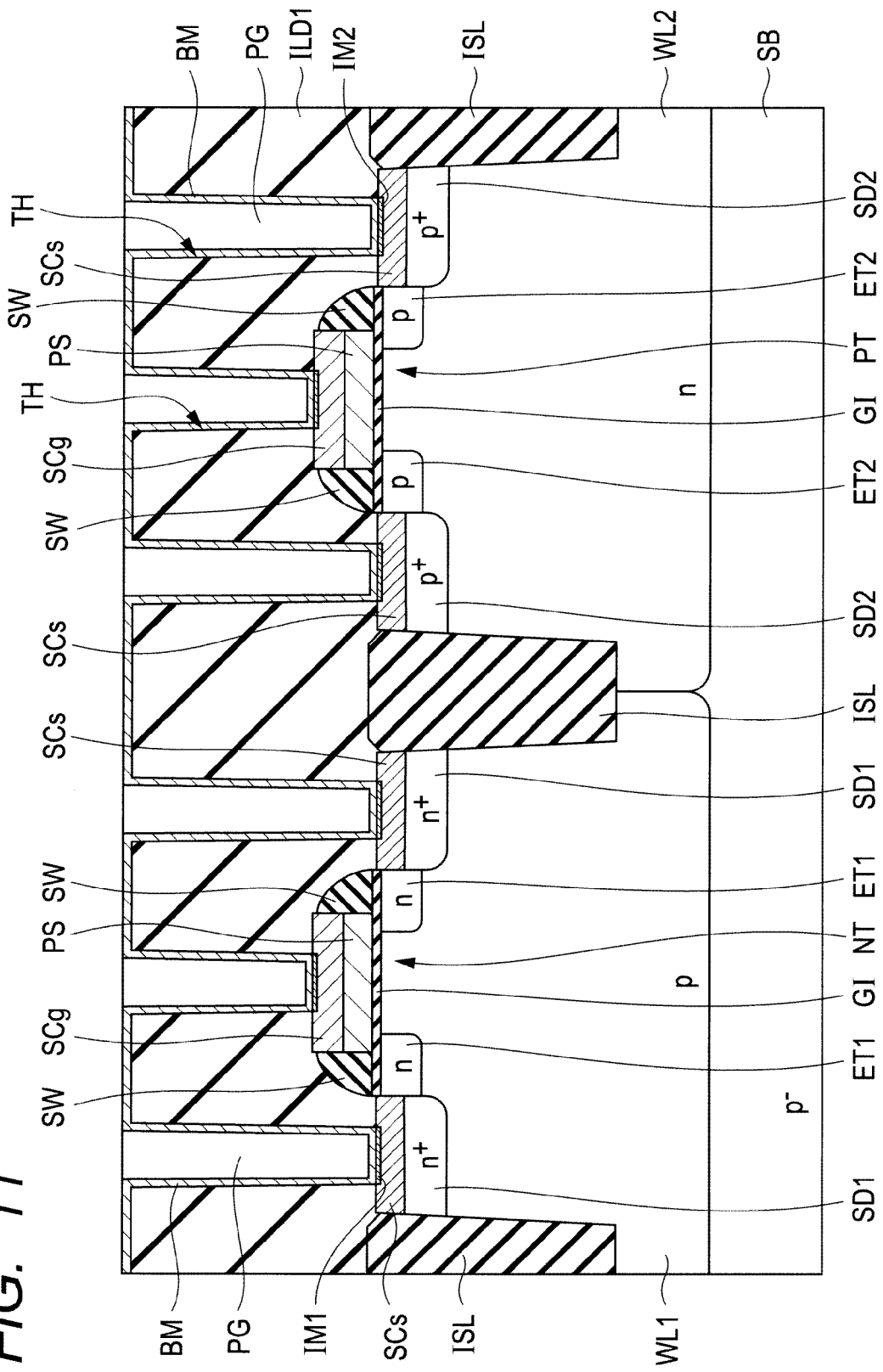
FIG. 11 is a cross-sectional view schematically showing a fifth step of the manufacturing method of the semiconductor device in the first embodiment of the invention.

Referring to FIGS. 3 and 11, in step S6, the plugs PG are formed to fill the through holes THs. Specifically, first, a W film is formed by the CVD method to fill each through hole TH. Then, the W film and the barrier metal film BM are removed by being ground by the CMP method so as to expose the upper surface of the interlayer insulating film ILD1.

Referring to FIGS. 3 and 1, in step S7, metal wiring layers ML and ML are formed so as to be respectively coupled to the first silicide portion SCs and the second silicide portion SCg by the plugs PGs. Further, the interlayer insulating film ILD2 is also formed between the metal wiring layers ML and ML. The metal wiring layer ML is comprised of, for example, an Al (aluminum) wiring or a Cu (copper) wiring.

As mentioned above, the semiconductor device of this embodiment (see FIG. 1) is obtained. According to this embodiment, the reaction between the Ti film TF and each of the silicide regions SCs and SCg is activated at the bottom of each through hole TH in nitriding (see FIG. 6: in step S51) of the Ti film TF (see FIG. 9), so that the insulated part between the Ti film TF and each of the silicide regions SCs and SCg is changed to the ohmic contact state. An electrical resistance between each of the silicide regions SCs and SCg and the barrier metal film BM (see FIG. 10) is reduced. Thus, an electrical resistance between the plug PG formed over the barrier metal film BM and each of the silicide regions SCs and SCg can be reduced.

Exposure of the Ti film TF to the atmosphere containing plasma can further activate the above reaction. The use of $NH_3$ plasma as the plasma can activate especially the above-described reaction. The $NH_3$ plasma can remove Cl (chlorine) contained in the Ti film TF therefrom.

The highly stable Ni—X bond is formed in the silicide regions SCs and SCg by allowing the silicide to contain the element X. Even when the silicide regions SCs and SCg exposed to the bottom of each through hole TH is oxidized due to influences of gas for dry etching (see FIG. 5: in step S42) or the like, the Ni—X bond can be maintained at the surface of each of the silicide regions SCs and SCg. That is, the above oxidation can prevent the bond at the surface of the silicide regions SCs and SCg from changing to the Ni—O bond.

Figure 6:
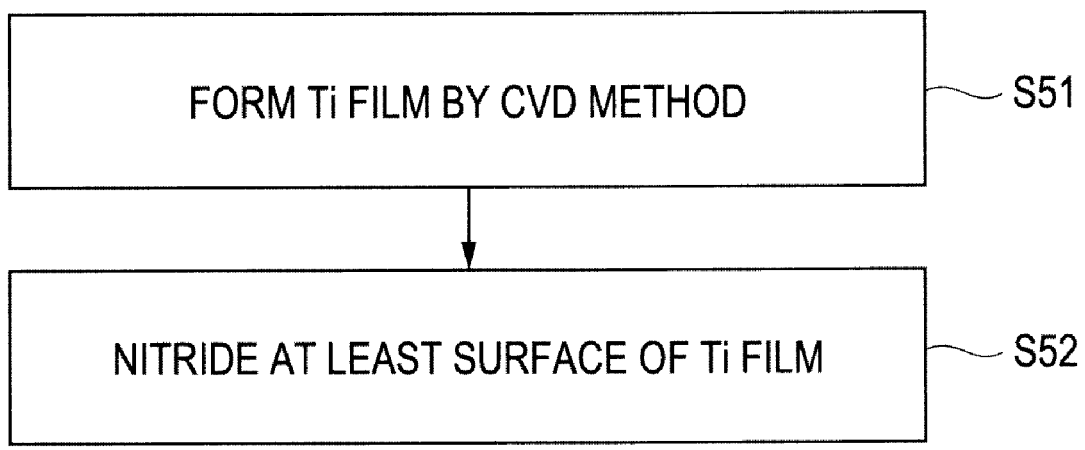
FIG. 6 is a flowchart for explaining processes for forming a barrier metal film shown in FIG. 3.

If the rate of the Ni—O bond at the surface of each of the silicide regions SCs and SCg becomes large, an oxide film tends to be easily formed between each of the silicide regions SCs and SCg and the Ti film TF when the Ti film TF is formed over the silicide regions SCs and SCg (see FIG. 6: in step S51). The influence of the oxide film makes it difficult to make ohmic electrical contact between each of the silicide regions SCs and SCg and the barrier metal film BM including the Ti film TF. In some cases, the electrical contact cannot be obtained. In this case, even if an initial resistance between each of the silicide regions SCs and SCg and the barrier film BM is sufficiently low, the oxide film may react with the barrier metal film during storage of the semiconductor device at high temperature to cause fluctuations in resistance, which possibly reduces the reliability of the semiconductor device.

When the semiconductor device includes both the n-MOS transistor NT and the p-MOS transistor PT, the thickness of the above oxide film of the n-MOS transistor NT tends to become larger than that of the p-MOS transistor PT. Thus, when some means is taken to surely remove the oxide film from the n-MOS transistor NT, the silicide regions SCs and SCg may be removed from the p-MOS transistor PT. As a result, the yield of the semiconductor devices may be reduced. However, this embodiment eliminates the necessity of removal of such an oxide film, and thus can enhance the yield of the semiconductor devices.

Since the concentration of Ti—Ni—O—N bond in the intermediate film IM is low, the formation of the above oxide film, which may be easily generated together with the Ti—Ni—O—N bond in the intermediate film IM, is suppressed. An electrical route is formed between each of the silicide regions SCs and SCg and the barrier metal film BM via the intermediate film IM, and the electrical resistance of the electrical route is reduced. Thus, the electrical resistance between the silicide regions SCs and SCg and the plug PG formed over the barrier metal film BM can be made small.

As described above, this embodiment can suppress the electrical resistance between each of the silicide regions SCs and SCg and the plug PG. The following will describe examples of this embodiment by comparing the examination results of this embodiment to those of comparative examples.

The formation of a barrier metal film in a first comparative example differs from this embodiment in that the barrier metal film formation involves formation of a Ti film by a PVD method, and formation of a TiN film over the Ti film by the CVD method. The formation of a barrier metal film in a second comparative example is performed in the same way as that of the first comparative example, so that a silicide region of the second comparative example is formed of a simple Ni silicide, and not a Ni alloy. In each of this embodiment and the first and second comparative examples, the electrical resistance R ($\Omega$) between the silicide region and the plug is measured.

Figure 12:
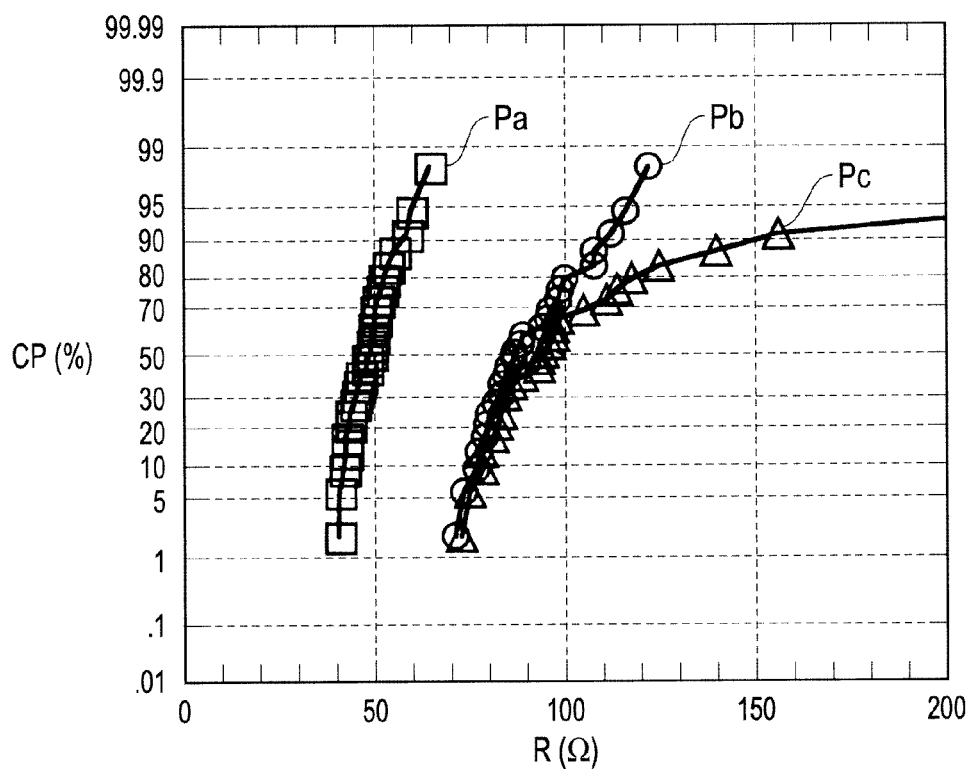
FIG. 12 is a graph showing an example of the measurement result of an electrical resistance between a plug and a silicide region in each of an example of the first embodiment of the invention, and first and second comparative examples.

FIG. 12 shows cumulative probabilities CP (%) of the above electrical resistances R in this embodiment, the first comparative example, and the second comparative example as plots Pa, Pb, and Pc. As compared to this embodiment (plot Pa), the first comparative example (plot Pb) has the electrical resistance R increased, and the second comparative example (plot Pc) leads to variations in electrical resistance R. This result has shown that this embodiment can stably suppress the electrical resistance between each of the silicide regions SCs and SCg and the plug PG.

A silicide region in the third comparative example differs from that of this embodiment in that the silicide region is formed of the simple Ni silicide ($NiSi_x$) and not a Ni alloy. In contrast, the silicide region of this embodiment is comprised of $NiPtSi_x$. The dry-etched surface of the silicide region is analyzed by X-ray photoelectron spectroscopy.

Figure 13:
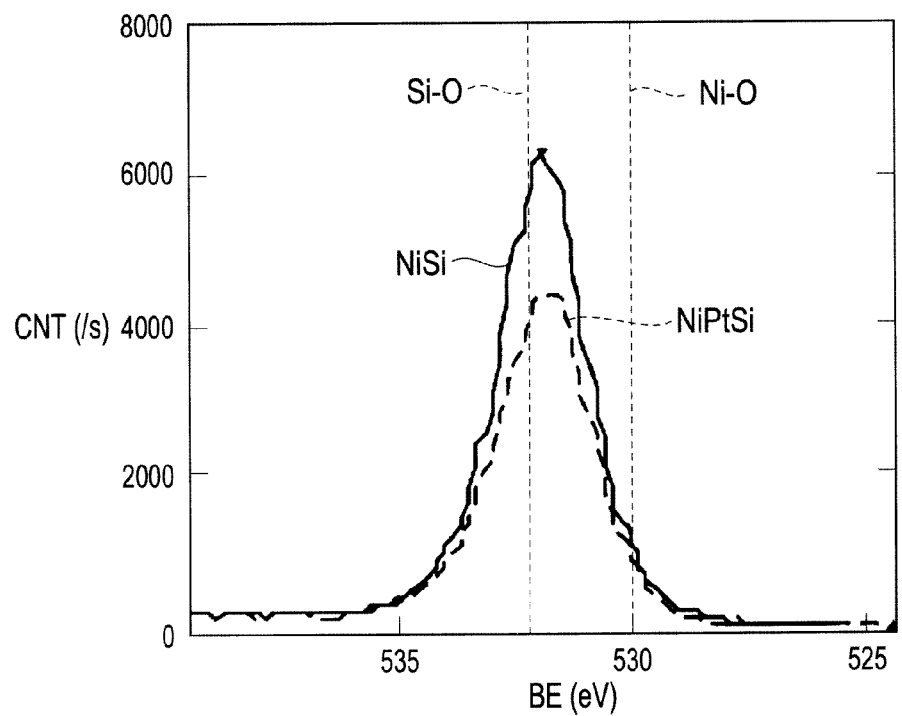
FIG. 13 is a graph showing an example of the analysis results of a dry-etched surface of a silicide region by X-ray photoelectron spectroscopy in each of the example of the first embodiment of the invention and a third comparative example.
Figure 14:
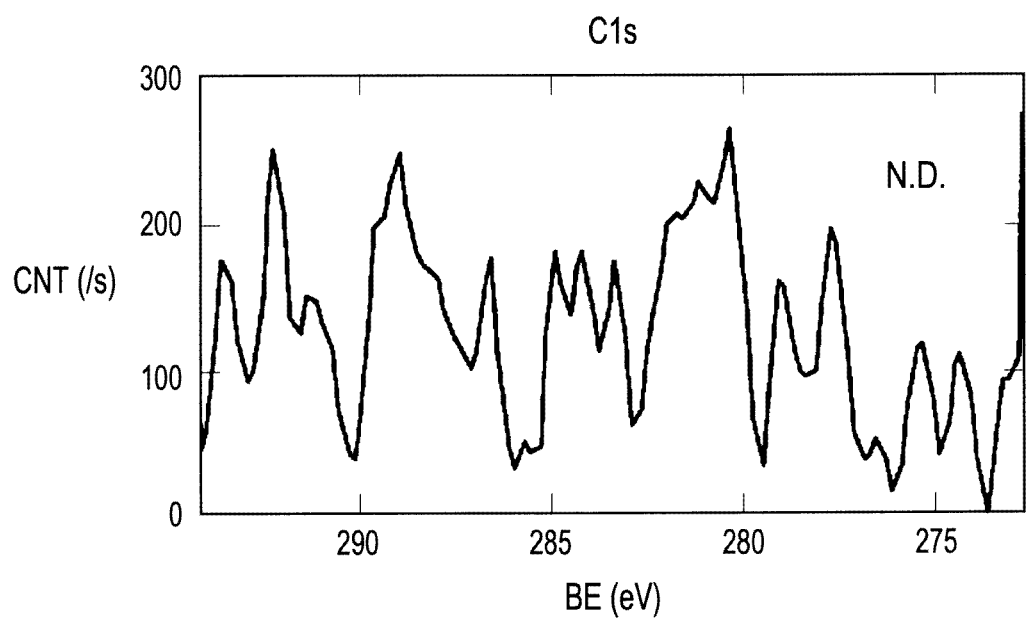
FIG. 14 is a graph showing an example of the analysis results of a C 1s spectrum of a surface obtained after formation of a Ti film by use of the X-ray photoelectron spectroscopy in a fourth comparative example.
Figure 15:
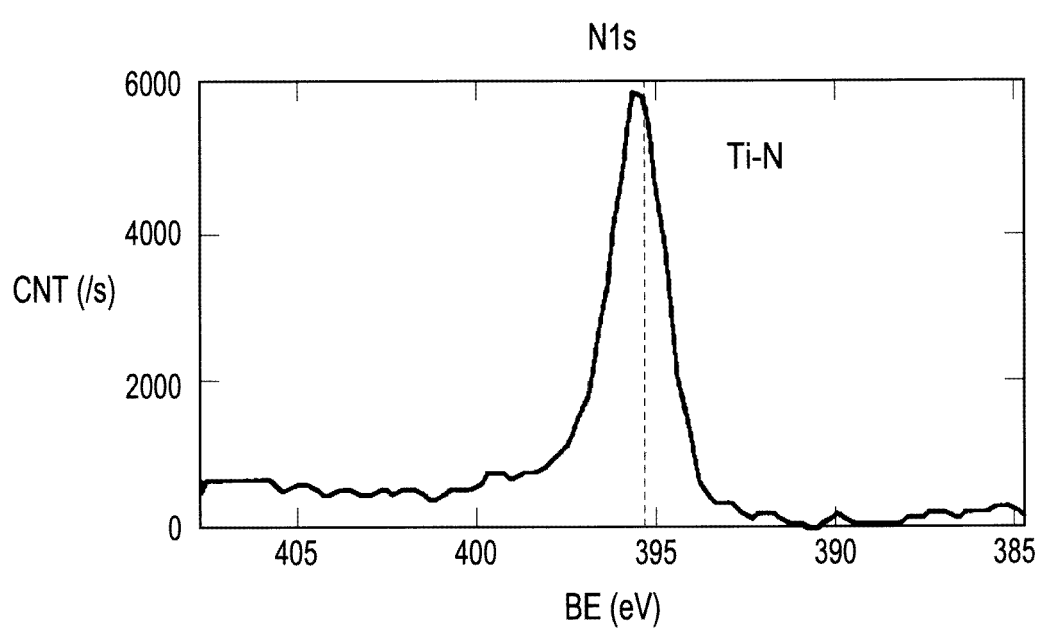
FIG. 15 is a graph showing an example of the analysis results of a N 1s spectrum of the surface obtained after formation of the Ti film by use of the X-ray photoelectron spectroscopy in the fourth comparative example.
Figure 16:
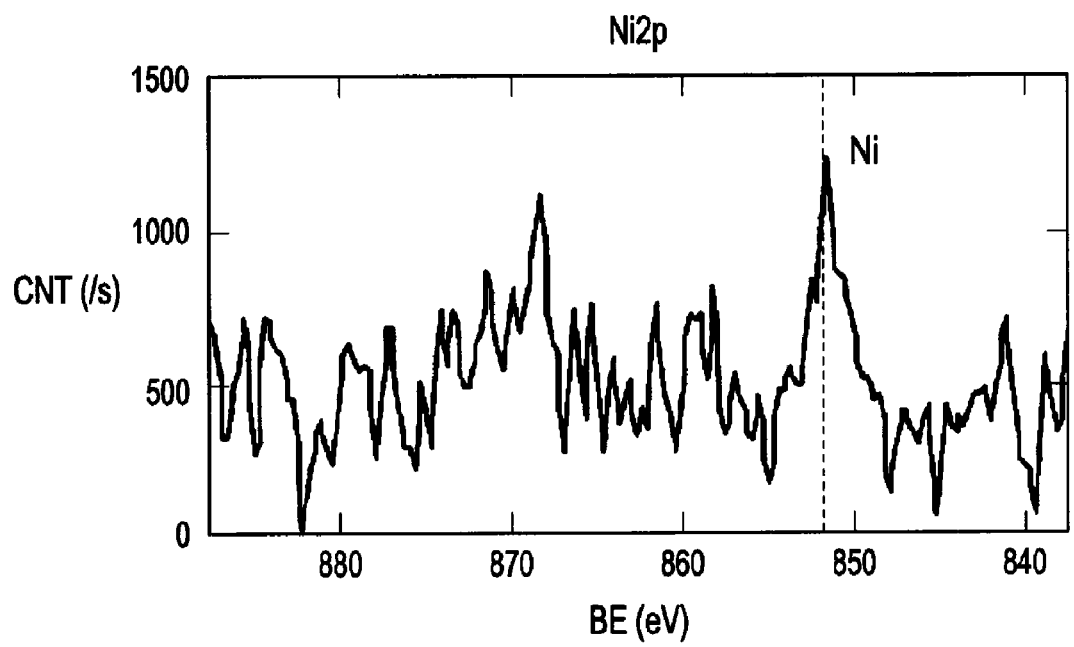
FIG. 16 is a graph showing an example of the analysis results of a N 2p spectrum of the surface obtained after formation of the Ti film by use of the X-ray photoelectron spectroscopy in the fourth comparative example.
Figure 17:
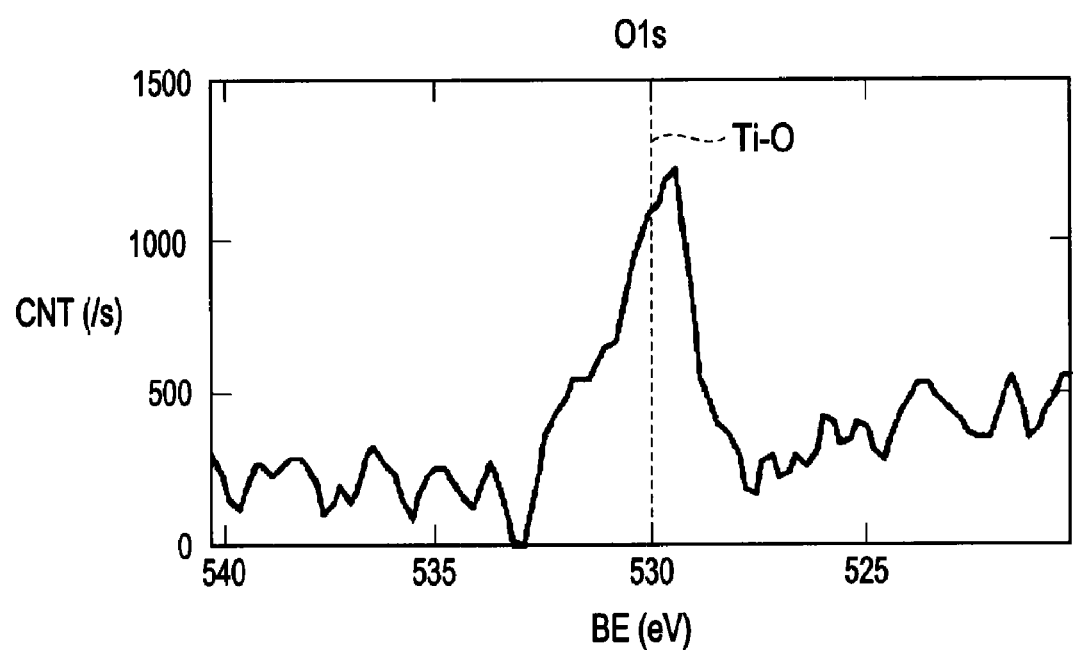
FIG. 17 is a graph showing an example of the analysis results of an O 1s spectrum of the surface obtained after formation of the Ti film by use of the X-ray photoelectron spectroscopy in the fourth comparative example.
Figure 18:
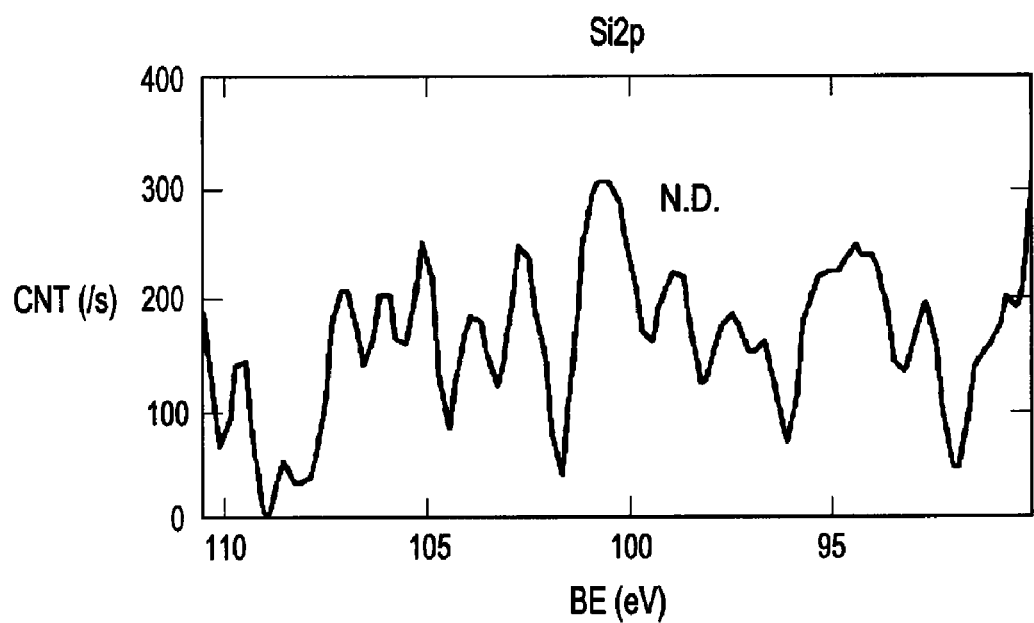
FIG. 18 is a graph showing an example of the analysis results of a Si 2p spectrum of the surface obtained after formation of the Ti film by use of the X-ray photoelectron spectroscopy in the fourth comparative example.
Figure 19:
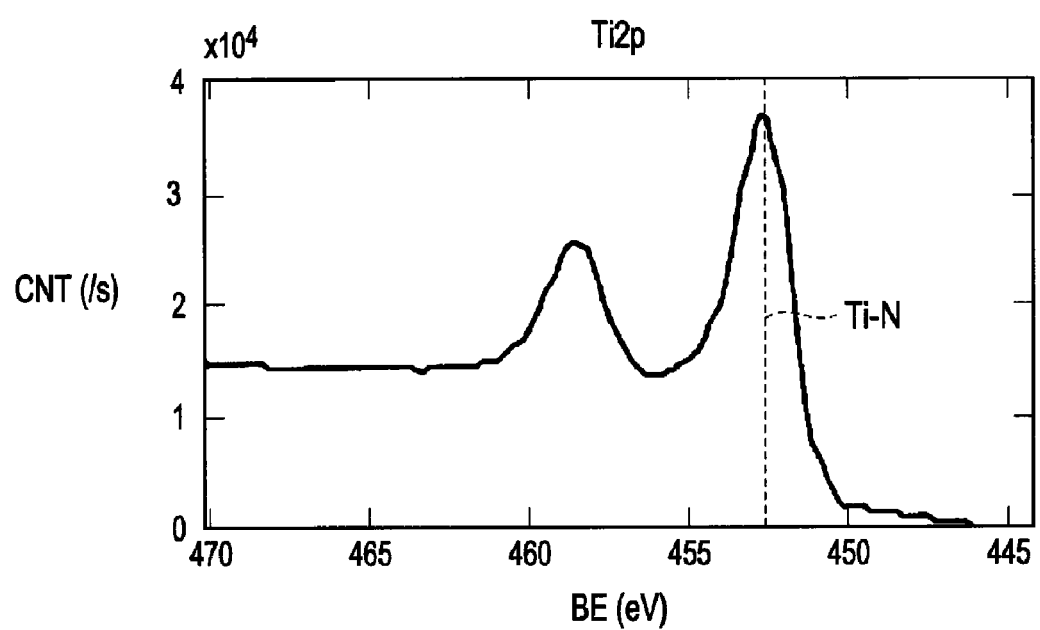
FIG. 19 is a graph showing an example of the analysis results of a Ti 2p spectrum of the surface obtained after formation of the Ti film by use of the X-ray photoelectron spectroscopy in the fourth comparative example.
Figure 20:
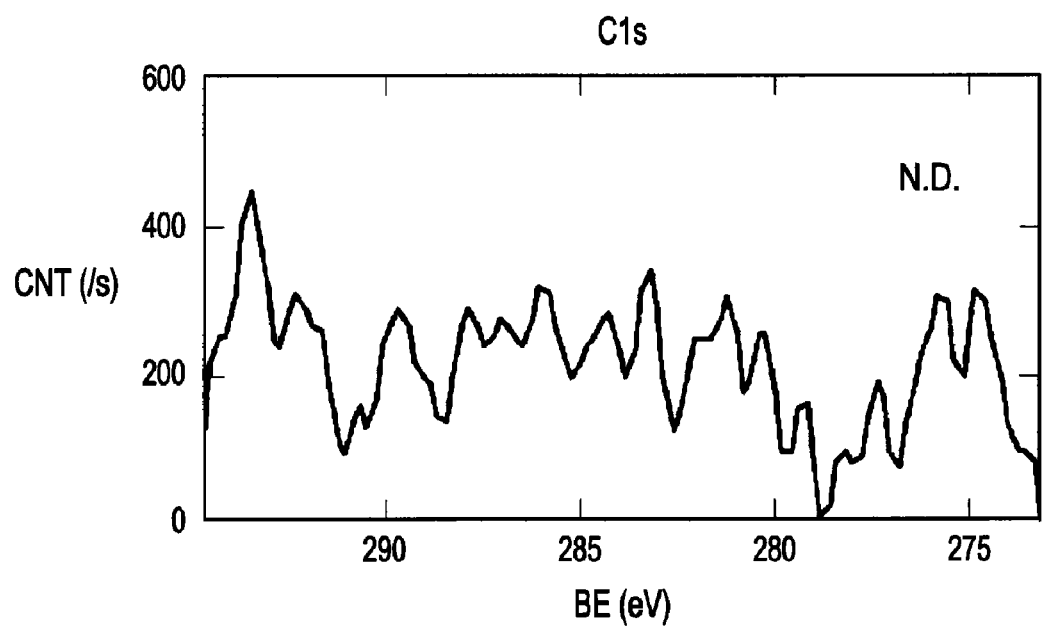
FIG. 20 is a graph showing an example of the analysis results of a C 1s spectrum of a surface obtained after formation of a Ti film by use of the X-ray photoelectron spectroscopy in a fifth comparative example.
Figure 21:
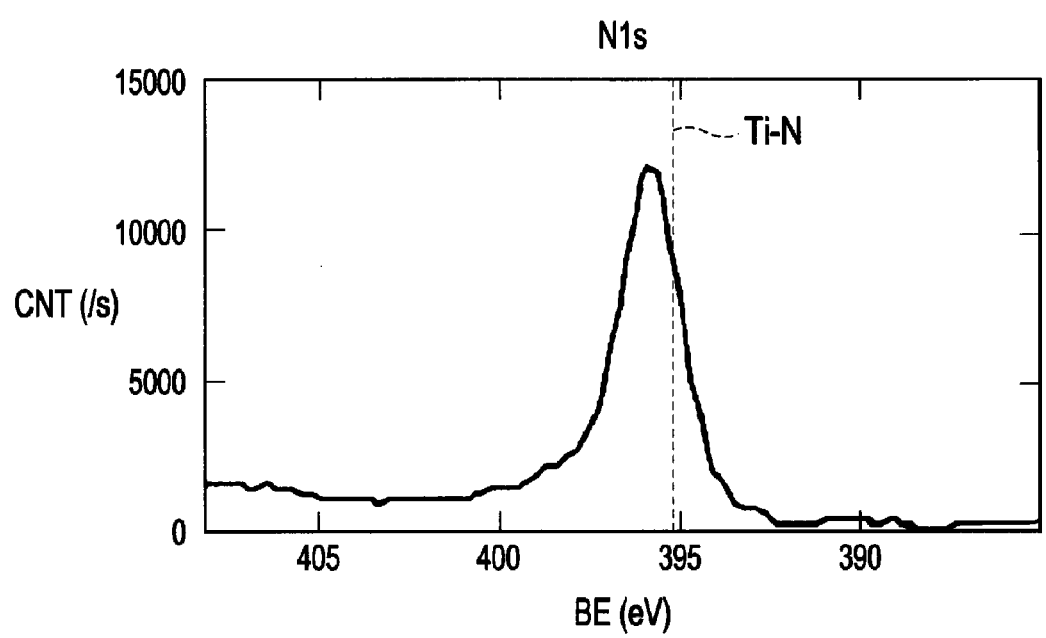
FIG. 21 is a graph showing an example of the analysis results of a N 1s spectrum of the surface obtained after formation of the Ti film by use of the X-ray photoelectron spectroscopy in the fifth comparative example.
Figure 22:
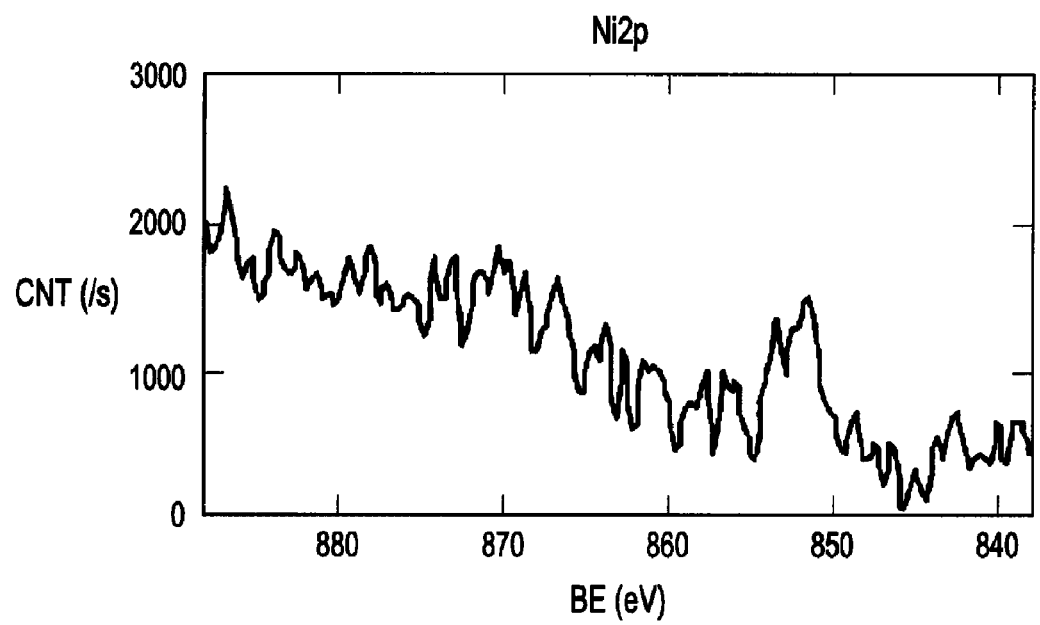
FIG. 22 is a graph showing an example of the analysis results of a Ni 2p spectrum of the surface obtained after formation of the Ti film by use of the X-ray photoelectron spectroscopy in the fifth comparative example.
Figure 23:
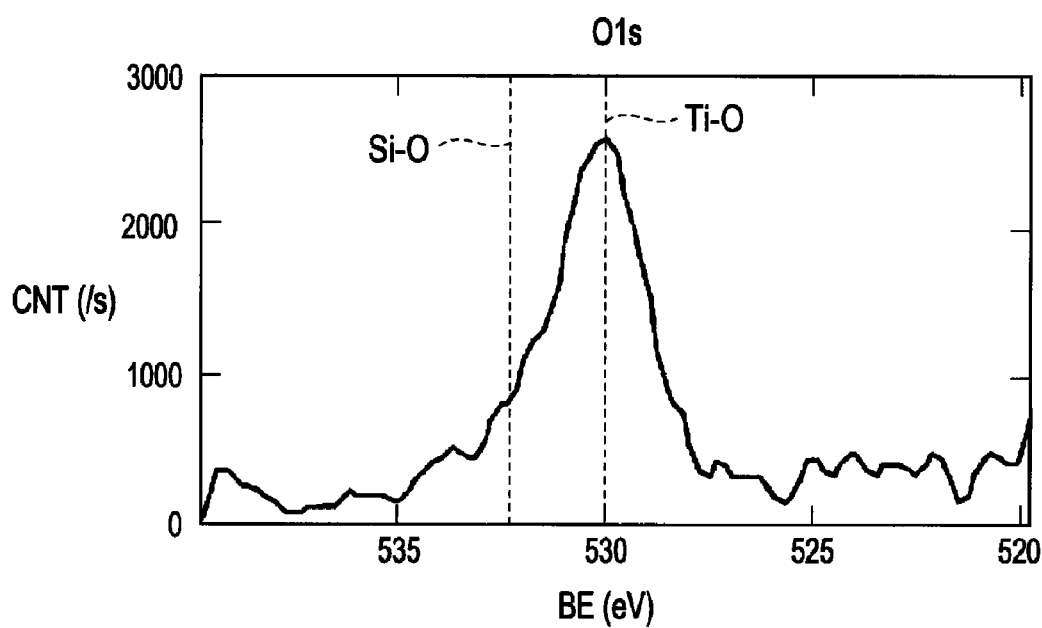
FIG. 23 is a graph showing an example of the analysis results of an O 1s spectrum of the surface obtained after formation of the Ti film by use of the X-ray photoelectron spectroscopy in the fifth comparative example.
Figure 24:
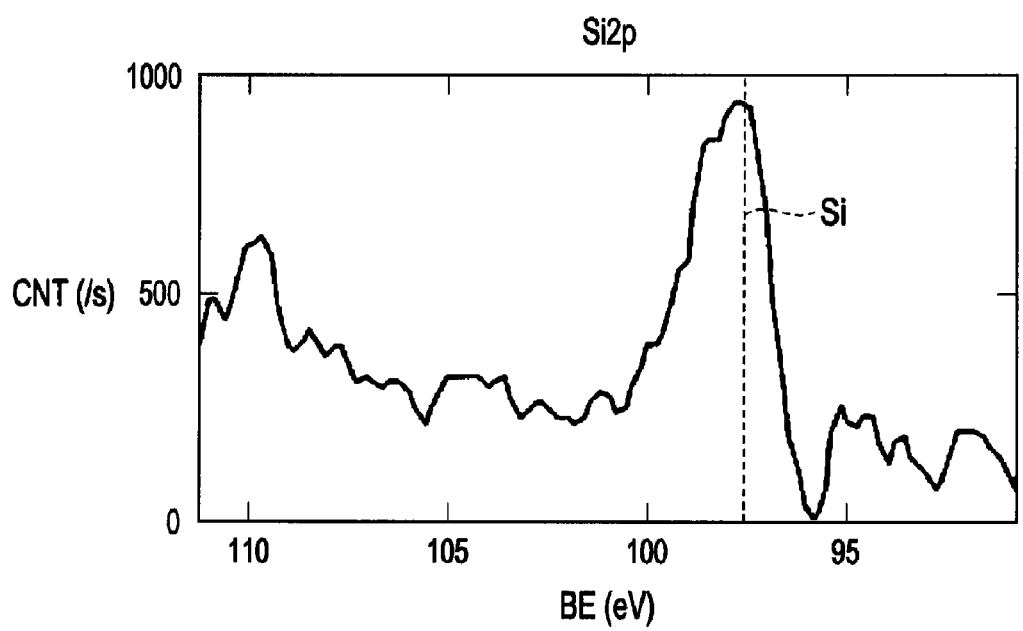
FIG. 24 is a graph showing an example of the analysis results of a Si 2p spectrum of the surface obtained after formation of the Ti film by use of the X-ray photoelectron spectroscopy in the fifth comparative example.
Figure 25:
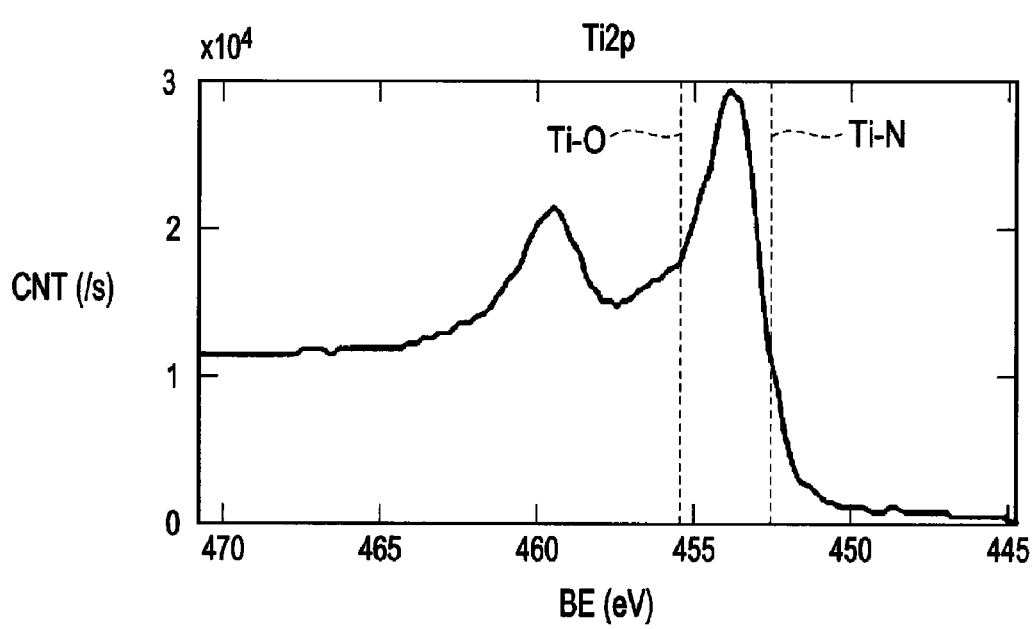
FIG. 25 is a graph showing an example of the analysis results of a Ti 2p spectrum of the surface obtained after formation of the Ti film by use of the X-ray photoelectron spectroscopy in the fifth comparative example.

With reference to FIG. 13, the analysis results provided by the above X-ray photoelectron spectroscopy are shown while the horizontal axis is a binding energy BE (eV), and the longitudinal axis is a count CNT (/s). This result has shown that the surface oxidation of the silicide region of this embodiment is suppressed as compared to the third comparative example.

The fourth and fifth comparative examples will be describe below. The silicide region in each of the fourth and fifth comparative examples is comprised of $NiSi_x$. In the fourth comparative example, a Ti film is formed over the silicide region by the PVD method. In the fifth comparative example, a Ti film is formed over the silicide region by the CVD method.

Referring to FIGS. 14 to 19 and FIGS. 20 to 25, in the fourth and fifth comparative examples, the surface obtained after formation of the Ti film is analyzed by the X-ray photoelectron spectroscopy. This analysis result has shown that the influences given by the formation methods of the Ti film are remarkable at each of Ni2p and Si2p. That is, a Ni peak at the Ni2p bond is apparently detected in the case of the PVD method (of the fourth comparative example), and a bonding peak corresponding thereto is not detected in the case of the CVD method (of the fifth comparative example). No Si peak at the Si2p bond is apparently detected in the case of the PVD method, and a Si peak is apparently detected in the case of the CVD method. As explained in the description of the first embodiment, the intermediate film IM contains at least either a Ti (titanium)-Si (silicon)-O (oxygen)-N (nitrogen) bond or a Ti (titanium)-X (element X)-Si (silicon)-O (oxygen)-N (nitrogen) bond. The total concentration of the above-mentioned bond in the intermediate film is higher than the Ti (titanium)-Ni (nickel)-O (oxygen)-N (nitrogen) bond. In the fourth comparative example, the Ni peak is detected on the surface obtained after formation of the Ti film. This means that the amount of Ni serving as non-ohmic contact material, such as Ti (titanium)-Ni (nickel)-O (oxygen)-N (nitrogen) bond, is great, and that the formation of the Ti film by the PVD method is not good because it makes the ohmic characteristics worse. In the fifth comparative example, the Si peak is detected on the surface obtained after formation of the Ti film. This means that the amount of Si serving as good ohmic contact material, such as Ti (titanium)-Si (silicon)-O (oxygen)-N (nitrogen) bond, or Ti (titanium)-X (element X)-Si (silicon)-O (oxygen)-N (nitrogen) bond, is great, and that the formation of the Ti film by the CVD method makes the ohmic characteristics better.

Second Preferred Embodiment

Figure 26:
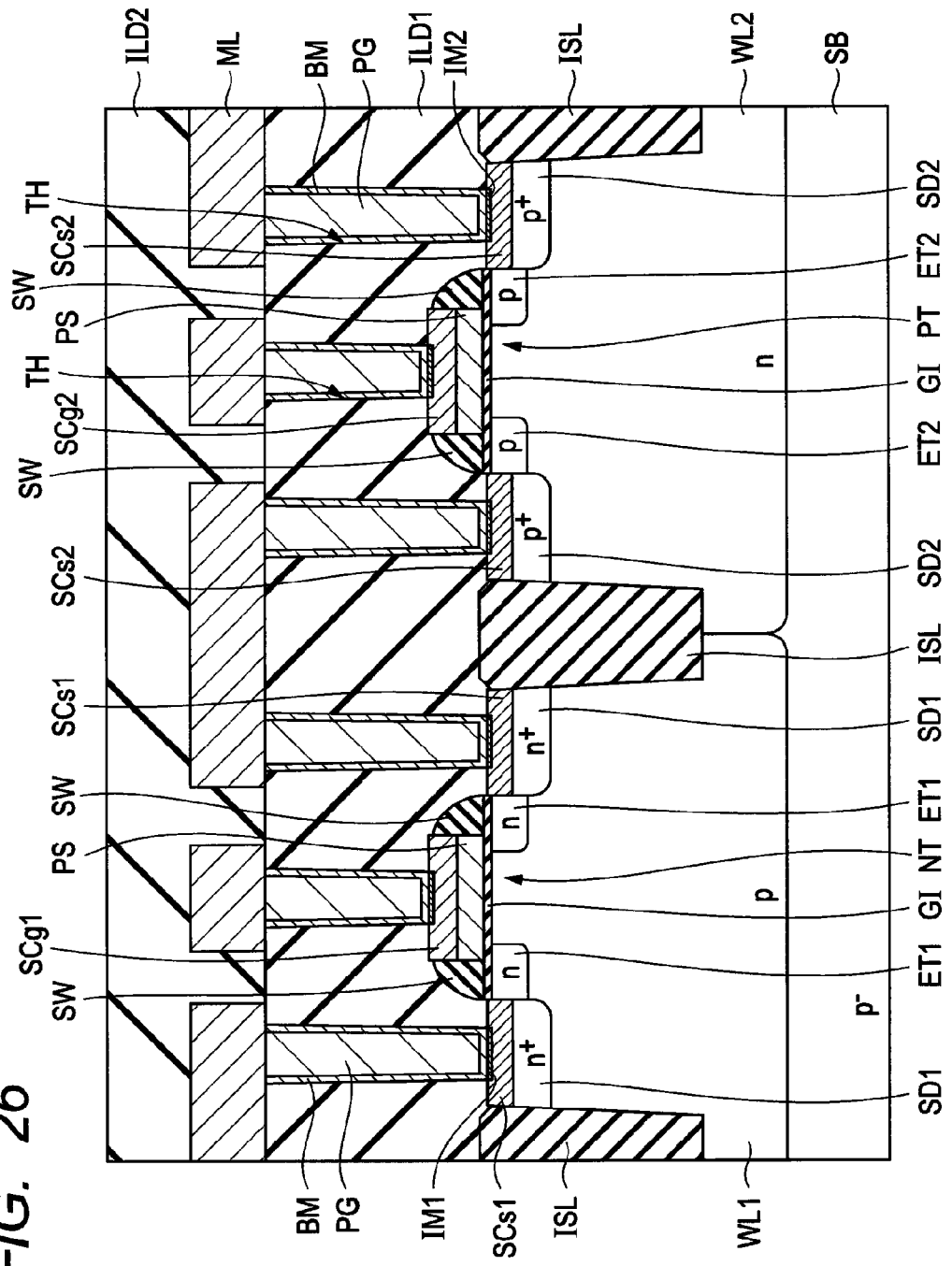
FIG. 26 is a cross-sectional view schematically showing the structure of a semiconductor device according to a second embodiment of the invention.

Referring to FIG. 26, a semiconductor device of this embodiment is provided with silicide regions SCs1 and SCg1 in a region above a p-well WL1 (in a region where an n-MOS transistor NT is formed), and silicide regions SCs2 and SCg2 in a region above an n-well WL2 (in a region where a p-MOS transistor PT is formed), instead of the silicide regions SCs and SCg of the first embodiment. The silicide regions SCs1 and SCg1 each include a silicide of an alloy of Ni and at least one element X1 selected from the group comprising Pt, V, and Pd. The silicide regions SCs2 or SCg2 each include a silicide of an alloy of Ni and at least one element X2 selected from the group comprising Zr, Hf, and Nb.

In the semiconductor device of this embodiment, instead of the intermediate film IM of the first embodiment, an intermediate film IM1 is provided in a region above the p-well WL1 (in a region where the n-MOS transistor NT is formed), and an intermediate film IM2 is provided in a region above the n-well WL2 (in a region where the p-MOS transistor PT is formed). The intermediate film IM1 is formed of a compound having Ti—Si—O—N bond and Ti—X1—Si—O—N bond. The total concentration of Ti—Si—O—N bond and Ti—Xi—Si—O—N bond in the intermediate film IM1 is higher than that of Ti—Ni—O—N bond therein. The intermediate film IM2 is formed of a compound having Ti—Si—O—N bond and Ti—X2—Si—O—N bond. The total concentration of Ti—Si—O—N bond and Ti—X2—Si—O—N bond in the intermediate film IM2 is higher than that of Ti—Ni—O—N bond therein.

Now, a manufacturing method of the semiconductor device according to this embodiment will be described below. In this embodiment, the process in step S2 (see FIG. 3) is individually performed on each of the regions above the p-well WL1 and the n-well WL2.

The following processes are performed on the region above the p-well WL1. An oxide film which is a silicide block layer is formed over the semiconductor substrate SB, for example, by the CVD method. Then, the oxide film on the p-well WL1 is selectively removed by anisotropic etching using the photolithography technique and etching technique. Thereafter, a high-melting-point metal film (not shown) is formed over the p-well WL1 region in the vacuum unit evacuated to vacuum so as to cover the polysilicon portion PS and the source and drain regions SD1s. The high-melting-point metal film is formed of an alloy (Ni alloy) containing Ni as a principal component, more specifically, material to which element X1 is added. The amount of addition of the element X1 is smaller than 10 atom %. The formation method of the high-melting point metal film is, for example, the PVD method or CVD method. Next, the same processes as those in steps S22 to S24 (see FIG. 4) of the first embodiment are performed. Thereafter, the above oxide film is removed by the so-called RCA cleaning.

The following processes are performed on the region above the n-well WL2. An oxide film which is a silicide block layer is formed over the semiconductor substrate SB, for example, by the CVD method. Then, the oxide film on the n-well WL2 is selectively removed by anisotropic etching using the photolithography technique and etching technique. Thereafter, a high-melting-point metal film (not shown) is formed over the n-well WL2 region in the vacuum unit evacuated to vacuum so as to cover the polysilicon portion PS and the source and drain regions SD2. The high-melting-point metal film is formed of an alloy (Ni alloy) containing Ni as a principal component, more specifically, material to which element X2 is added. The amount of addition of the element X2 is smaller than 10 atom %. The formation method of the high-melting-point metal film is, for example, the PVD method or CVD method. Next, the same processes as those in steps S22 to S24 (see FIG. 4) of the first embodiment are performed. Thereafter, the above oxide film is removed by the so-called RCA cleaning.

The order of the processes performed on the regions above the respective p-well WL1 and n-well WL2 described above can be replaced.

The structures of other components except for the above-mentioned elements are substantially the same as those of the first embodiment as described above. The same or like components are designated by the same reference characters, and a description thereof will not be repeated.

According to this embodiment, the same effect as that of the first embodiment is obtained. The n-MOS transistor NT and the p-MOS transistor PT can include different silicide materials in use.

Although the nitriding process of the Ti film TF is performed using the plasma (see FIG. 6, in step S52) in the above description, the nitriding method is not limited thereto. For example, the Ti film TF heated may be exposed to an atmosphere containing nitrogen gas without using the plasma.

The chemical cleaning (see FIG. 5, in step S44) may be performed in the plasma so as to improve a removing capability of the residue.

It is to be understood that the foregoing description of the preferred embodiments of the invention has been presented for the purposes of illustration and example only from all viewpoints, and does not limit the invention to the precise form disclosed. It is intended that the scope of the invention be limited not by the above detailed description, but rather by the claims appended thereto. All modifications are intended to fall within the spirit and scope of the appended claims and their equivalents.

The invention can be advantageously applied to, in particular, semiconductor devices with a silicide region, and a manufacturing method thereof.

What is claimed is:
1. A semiconductor device, comprising:
a semiconductor substrate;
at least one semiconductor element formed over the semiconductor substrate, each of said at least one semicon- ductor element including a silicide region comprised of a silicide of an alloy of Ni and at least one element X selected from the group comprising Pt, V, Pd, Zr, Hf and Nb;

an interlayer insulating film provided over said at least one semiconductor element, said interlayer insulating film being provided with a through hole having an inner surface including a side comprised of the interlayer insulating film and a bottom surface comprised of the silicide region;

a barrier metal film including a TiN film covering the inner surface;

a plug filling the through hole via the barrier metal film; and an intermediate film formed between the silicide region and the barrier metal film, wherein a total concentration of Ti—Si—O—N bond and Ti—X—Si—O—N bond in the intermediate film is higher than that of Ti—Ni—O—N bond.

2. The semiconductor device according to claim 1, wherein said at least one semiconductor element includes at least one transistor, each having a source/drain region and a gate electrode, and wherein the silicide region includes a first silicide portion in contact with the source/drain region, and a second silicide portion serving as at least a part of the gate electrode.

3. The semiconductor device according to claim 1, wherein said at least one transistor includes an n-type transistor and a p-type transistor.

* * * * *